(12) United States Patent
Nabetani

(10) Patent No.: US 7,576,541 B2
(45) Date of Patent: Aug. 18, 2009

(54) RF COIL FOR MRI APPARATUS, METHOD OF USING RF COIL FOR MRI APPARATUS, AND MRI APPARATUS

(75) Inventor: Akira Nabetani, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/938,639

(22) Filed: Nov. 12, 2007

(65) Prior Publication Data

US 2008/0111549 A1 May 15, 2008

(30) Foreign Application Priority Data

Nov. 15, 2006 (JP) ............................. 2006-308741

(51) Int. Cl.
*G01V 3/00* (2006.01)
(52) U.S. Cl. ...................................... 324/318; 324/322
(58) Field of Classification Search .................. 324/318, 324/322
See application file for complete search history.

(56) References Cited

U.S. PATENT DOCUMENTS

| | | | |
|---|---|---|---|
| 5,543,711 A | 8/1996 | Srinivasan et al. | |
| 5,804,969 A * | 9/1998 | Lian et al. | 324/318 |
| 5,929,639 A | 7/1999 | Doty | |
| 6,768,303 B1 | 7/2004 | Su et al. | |
| 6,975,115 B1 | 12/2005 | Fujita et al. | |
| 7,248,051 B2 * | 7/2007 | Wang et al. | 324/322 |

FOREIGN PATENT DOCUMENTS

| | | |
|---|---|---|
| JP | 9051887 | 2/1997 |
| JP | 2002-306442 | 10/2002 |
| JP | 2005021325 | 1/2005 |

* cited by examiner

*Primary Examiner*—Brij B. Shrivastav
*Assistant Examiner*—Megann E Vaughn
(74) *Attorney, Agent, or Firm*—Armstrong Teasdale LLP

(57) ABSTRACT

A RF coil according to the invention is made up of an 8-shaped coil having a crossed conductive path, and an impedance adjustment coil that performs connection between crossing points of the conductive path. The crossing points of the conductive path are connected in parallel by the impedance adjustment coil and a floating capacitance between the crossing points of the conductive path. An impedance between the crossing points of the conductive path is increased, and a current that flows between the crossing points of the conductive path reduces in a Larmor frequency that is in proportion to the intensity of the magnetostatic field of an MRI apparatus. The RF coil according to the invention is made up of an 8-shaped coil having a crossed conductive path, an impedance adjustment coil that performs connection between the crossing points of the conductive path in parallel, and an impedance adjustment coil.

20 Claims, 7 Drawing Sheets

FIG. 4
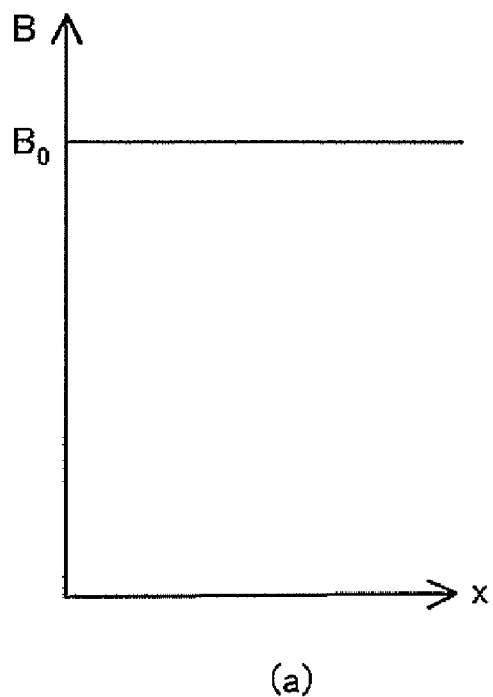
(a)
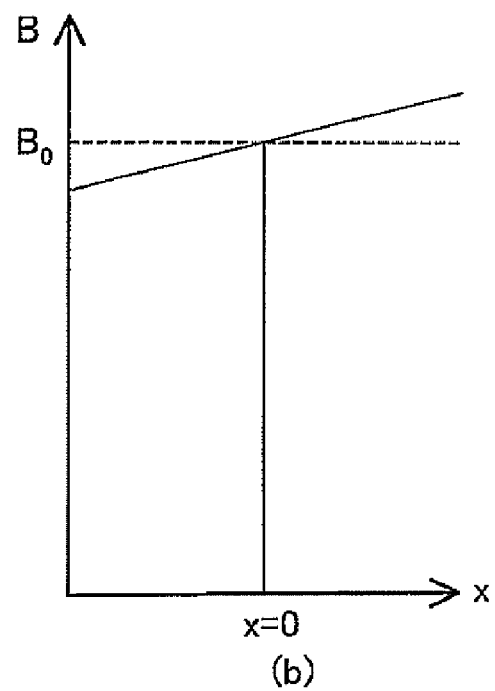
(b)

FIG. 7 (PRIOR ART)
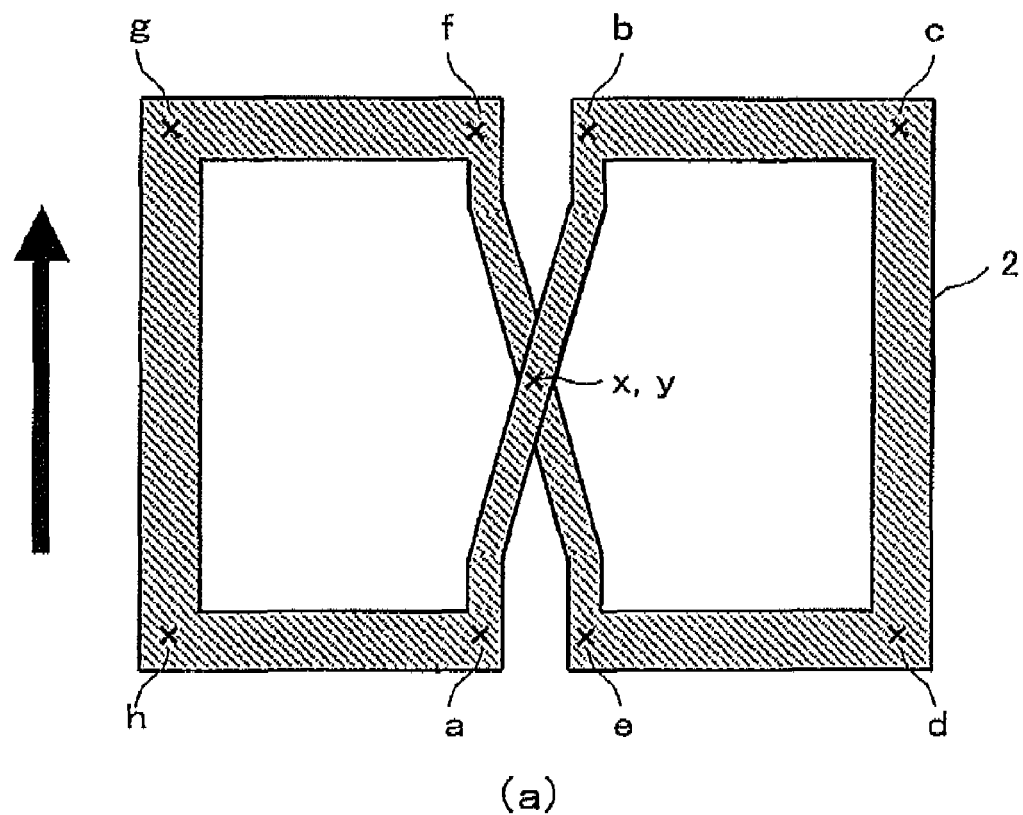
(a)
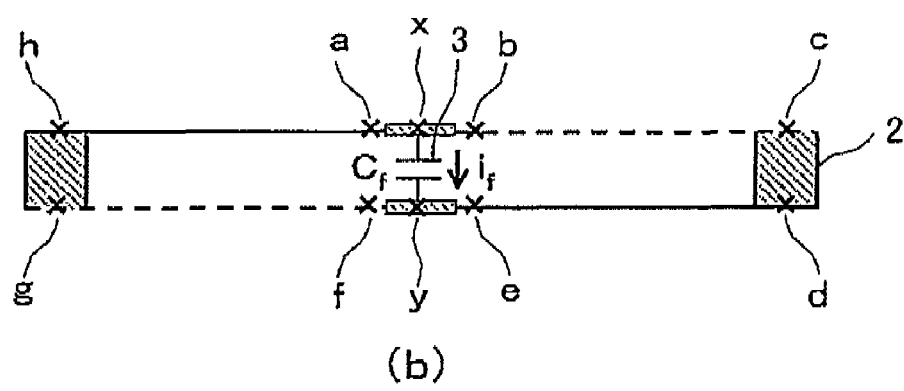
(b)

RF COIL FOR MRI APPARATUS, METHOD OF USING RF COIL FOR MRI APPARATUS, AND MRI APPARATUS

CROSS REFERENCE TO RELATED APPLICATIONS

This application claims the benefit of Japanese Patent Application No. 2006-308741 filed Nov. 15, 2006.

BACKGROUND OF THE INVENTION

The present invention relates to an RF coil for an MRI apparatus, a method of using the RF coil for an MRI apparatus, and the MRI apparatus. More particularly, the present invention relates to an RF coil for an MRI apparatus having a Figure-8 configuration for receiving a magnetic resonance signal from an object to be detected, a method of using the RF coil for an MRI apparatus, and an MRI apparatus using the method. The coil having a figure-8 configuration is referred to herein as an 8-shaped coil.

The MRI apparatus generates a magnetic resonance signal by the aid of a magnetic resonance phenomenon, and takes a tomographic image of the object to be detected. In the MRI apparatus, an improvement in the efficiency of the RF coil that transmits the RF pulse and receives the magnetic resonance signal is an important purpose that leads to an improvement in the image quality and a reduction in the imaging time.

FIGS. 7(a) and 7(b) are diagrams showing the 8-shaped coil. FIG. 7(a) is a diagram viewing the 8-shaped coil 2 from the above, and FIG. 7(b) is a diagram viewing the 8-shaped coil 2 along a direction indicated by an arrow of FIG. 7(a). The 8-shaped coil 2 forms two loops of a conductive path, and the conductive path crosses at an x-point and a y-point in the centers of those loops. The 8-shaped coil 2 is used to transmit an RF pulse and receive a magnetic resonance signal in the MRI apparatus (for example, refer to Patent document 1).

The conductive path of the 8-shaped coil 2 is ideally a→b→c→d→e→f→g→h→a. However, because the conductive path are overlapped with each other through a thin insulator at the x point and the y point in the center of the 8-shaped coil 2, a floating capacitance 3 that is determined according to a geometric configuration of an overlapped portion is developed between the x point and the y point. For that reason, a current $i_f$ that flows through the floating capacitance 3 exists in the overlapped portion of the conductive path. When it is assumed that the frequency of the transmitting RF pulse or the frequency of the received magnetic resonance signal (hereinafter referred to as "the frequency of the magnetic resonance signal") is ω, and the magnitude of the floating capacitance 3 is $C_f$, an impedance Z between the x point and the y point is represented by Expression 1. The frequency ω is also represented by f=ω/2π.

$$Z = -\frac{j}{\omega C_f} = -\frac{j}{2\pi f C_f} \quad \text{[Ex. 1]}$$

From the above expression, when the floating capacitance 3 is large, or when the frequency ω is high, the impedance Z becomes small, and the current $i_f$ increases.

[Patent Document 1] Japanese Unexamined Patent Publication No. 2002-306442.

Up to now, because the frequency of the magnetic resonance signal of the MRI apparatus is low to the degree of about 64 MHz or lower, the impedance Z between the x point and the y point is large, the current $i_f$ that flows through the floating capacitance 3 is slight. However, in recent years, in order to improve the image quality of the reconstruction image, there has been developed an MRI apparatus that exceeds 100 MHz in the frequency of the magnetic resonance signal. It is impossible to ignore the effects of magnetic coupling between the right and left loops of the 8-shaped coil 2 which is developed by the current $i_f$, or magnetic coupling between the right and left loops and another transmission RF coil or another receiving RF coil. For that reason, when the current $i_f$ is large, it is necessary to add two or more decoupling circuits (at least one decoupling circuit in each of the right and left loops) for removing the magnetic coupling.

Also, even in the case where the frequency of the magnetic resonance signal in the MRI apparatus is low, when the 8-shaped coil 2 that is large in the configuration and large in the area of the overlapped portion of the conductive path is used, the floating capacitance 3 increases. For that reason, it is impossible to ignore the effect of the magnetic coupling between the right and left loops due to the current $i_f$, likewise.

It is possible to suppress the floating capacitance 3 to a small value by narrowing the width between the crossing points of the 8-shaped coil 2. However, in this method, because the resistance of the conductive path in the crossing points is large, the transmission efficiency of the RF pulse and the receiving sensitivity of the magnetic resonance signal in the 8-shaped coil 2 deteriorate.

SUMMARY OF THE INVENTION

It is desirable that problem described previously is solved.

In one aspect of the invention, an RF coil for an MRI apparatus according to the present invention includes: a figure-8 coil having an 8-shaped configuration in which a conductive path crosses; and an impedance adjustment coil that performs connection between crossing points of the conductive path, wherein the crossing points of the conductive path are connected in parallel through the impedance adjustment coil and a floating capacitance between the crossing points of the conductive path, and in a Larmor frequency that is in proportion to the intensity of a magnetostatic field, an impedance between the crossing points of the conductive path is increased and a current that flows between the crossing points of the conductive path is reduced.

It is preferable that in the RF coil for an MRI apparatus according to the present invention, the impedance adjustment coil and the floating capacitance that is developed between the crossing points of the conductive path resonate in parallel in the Larmor frequency that is in proportion to the intensity of the magnetostatic field.

It is preferable that the RF coil for an MRI apparatus according to the present invention further includes an impedance adjustment capacitor that performs connection between the crossing points of the conductive path, wherein the crossing point of the conductive path is connected in parallel by the impedance adjustment capacitor, the impedance adjustment coil, and the floating capacitance developed between the crossing points of the conductive path.

It is preferable that in the RF coil for an MRI apparatus according to the present invention, the impedance adjustment capacitor, the impedance adjustment coil, and the floating capacitance that is developed between the crossing points of the conductive path resonate in parallel in the Larmor frequency that is in proportion to the intensity of the magnetostatic field.

Also, according to the invention, there is provided a method of using an RF coil for an MRI apparatus that includes a figure-8 coil having an 8-shaped configuration in which a conductive path crosses, and an impedance adjustment coil that performs connection between crossing points of the conductive path, wherein the crossing points of the conductive path are connected in parallel through the impedance adjustment coil and a floating capacitance between the crossing points of the conductive path, and the method comprises applying a magnetostatic field of an intensity that an impedance between the crossing points of the conductive path is increased and a current that flows between the crossing points of the conductive path is reduced.

It is preferable that in the method of using an RF coil for an MRI apparatus, a magnetostatic field of the intensity that the impedance adjustment coil and the floating capacitance between the crossing points of the conductive path resonate in parallel is applied.

It is preferable that in the method of using an RF coil for an MRI apparatus, the RF coil for an MRI apparatus includes an impedance adjustment capacitor that performs connection between the crossing points of the conductive path, and the crossing points of the conductive path are connected in parallel by the impedance adjustment capacitor, the impedance adjustment coil, and the floating capacitance developed between the crossing points of the conductive path.

It is preferable that in the method of using the RF coil for an MRI apparatus according to the invention, the magnetostatic field of the intensity that the impedance adjustment capacitor, the impedance adjustment coil, and the floating capacitance that is developed between the crossing points of the conductive path resonate in parallel is applied.

Also, an MRI apparatus according to the invention includes an RF coil having a figure-8 coil of an 8-shaped configuration in which a conductive path crosses, and an impedance adjustment coil that performs connection between crossing points of the conductive path, wherein the crossing points of the conductive path are connected in parallel through the impedance adjustment coil and a floating capacitance between the crossing points of the conductive path, and in a Larmor frequency that is in proportion to the intensity of a magnetostatic field, an impedance between the crossing points of the conductive path is increased, and a current that flows between the crossing points of the conductive path is reduced, and wherein the RF coil is allowed to transmit the RF pulse, receive the magnetic resonance signal, or transmit the RF pulse and receive the magnetic resonance signal.

It is preferable that in the MRI apparatus according to the invention, the impedance adjustment coil and the floating capacitance that is developed between the crossing points of the conductive path resonate in parallel in the Larmor frequency that is in proportion to the intensity of the magnetostatic field.

It is preferable that the MRI apparatus according to the invention further includes an impedance adjustment capacitor that performs connection between the crossing points of the conductive path, wherein the crossing points of the conductive path are connected in parallel by the impedance adjustment capacitor, the impedance adjustment coil, and the floating capacitance developed between the crossing points of the conductive path.

It is preferable that in the MRI apparatus according to the invention, the impedance adjustment capacitor, the impedance adjustment coil, and the floating capacitance that is developed between the crossing points of the conductive path resonate in parallel in the Larmor frequency that is in proportion to the intensity of the magnetostatic field.

According to the invention, it is possible to reduce the number of decoupling circuits in an MRI apparatus, and improve the transmission efficiency of an RF pulse and the receiving sensitivity of a magnetic resonance signal in an RF coil having an 8-shaped configuration, with a reduction of a current that flows through the floating capacitance of the crossing points of a conductive path in the RF coil having the 8-shaped configuration.

Further objects and advantages of the present invention will be apparent from the following description of the preferred embodiments of the invention as illustrated in the accompanying drawings.

BRIEF DESCRIPTION OF THE DRAWINGS

FIG. 4(a) and FIG. 4(b) are diagrams showing a relationship of an intensity Bo between a gradient magnetic field and a magnetostatic field.

FIG. 7(a) and FIG. 7(b) are diagrams showing a known 8-shaped coil.

DETAILED DESCRIPTION OF THE INVENTION

Figure 1:
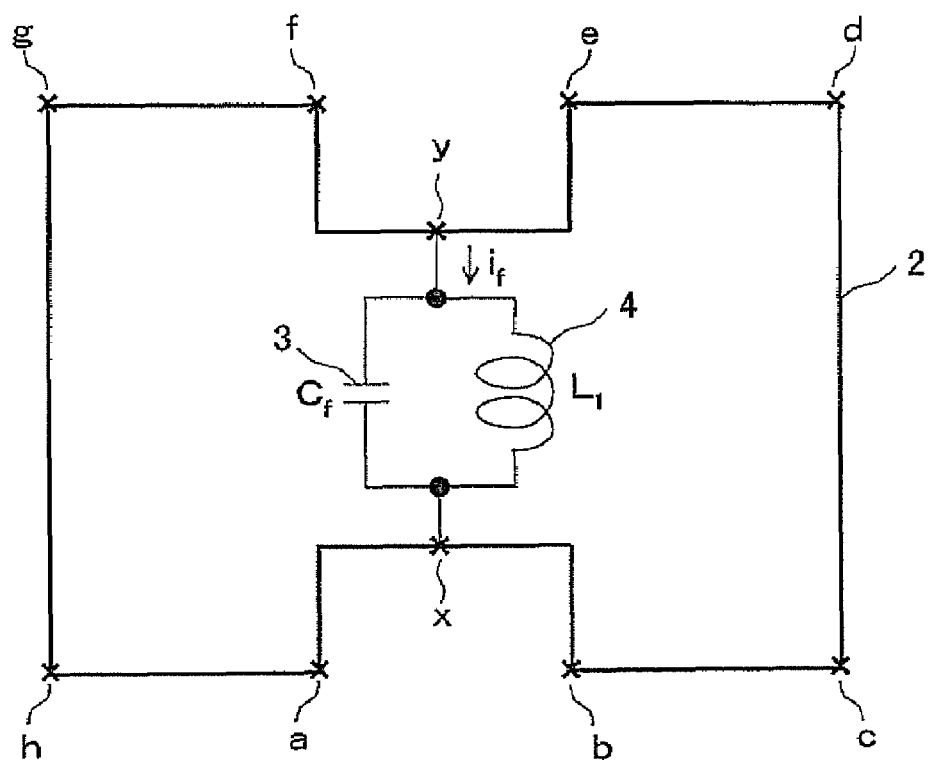
FIG. 1 is a diagram showing an RF coil according to a first embodiment of the invention.

FIG. 1 is a diagram showing an RF coil according to a first embodiment of the invention. An RF coil 1 is made up of an 8-shaped coil 2, and an impedance adjustment coil 4 that performs connection between an x point and a y point at which a conductive path of the 8-shaped coil 2 crosses. Because a floating capacitance 3 that is determined according to a geometric configuration of an overlapped portion is developed between the x point and the y point, the x point and the y point are connected in parallel by the floating capacitance 3 and the impedance adjustment coil 4. The 8-shaped coil 2 shown in FIG. 1 is a development of the crossing points of the conductive path on a plane, and the conductive path of the 8-shaped coil 2 actually has a given width, but is indicated by a line for simplification.

When it is assumed that the inductance of the impedance adjustment coil 4 is $L_1$, an impedance $Z_1$ between the x point and the y point is represented by the following expression in a frequency ω of a magnetic resonance signal.

$$Z_1 = -\frac{j}{\omega C_f - \frac{1}{\omega L_1}} \quad [\text{Ex. 2}]$$

As the values of $\omega C_f$ and $1/\omega L_1$ approach each other more, the impedance $Z_1$ becomes larger, and the current $i_f$ that flows between the x point and the y point is smaller.

When the floating capacitance 3 and the impedance adjustment coil 4 resonate in parallel, the absolute value of the impedance $Z_1$ becomes ideally infinitely large, and the current $i_f$ becomes 0. In this situation, the frequency $\omega_p$ is represented by the following expression.

$$\omega_P = \frac{1}{\sqrt{C_f L_1}} \quad [\text{Ex. 3}]$$

In fact, there exists no impedance adjustment coil of only the inductance $L_1$, and a resistance R exists although the resistance is extremely small. For that reason, the absolute value of the impedance $Z_1$ at the time of parallel resonance is represented by the following expression.

$$|Z_1| \cong \frac{L_1}{RC_f} \quad [\text{Ex. 4}]$$

As described above, when the inductance L1 of the impedance adjustment coil 4 is set so that the floating capacitance 3 and the impedance adjustment coil 4 resonate in parallel with the frequency $\omega_p$ of the magnetic resonance signal, the impedance $Z_1$ becomes an external value, and the current $i_f$ that flows between the x point and the y point becomes minimum.

Figure 2:
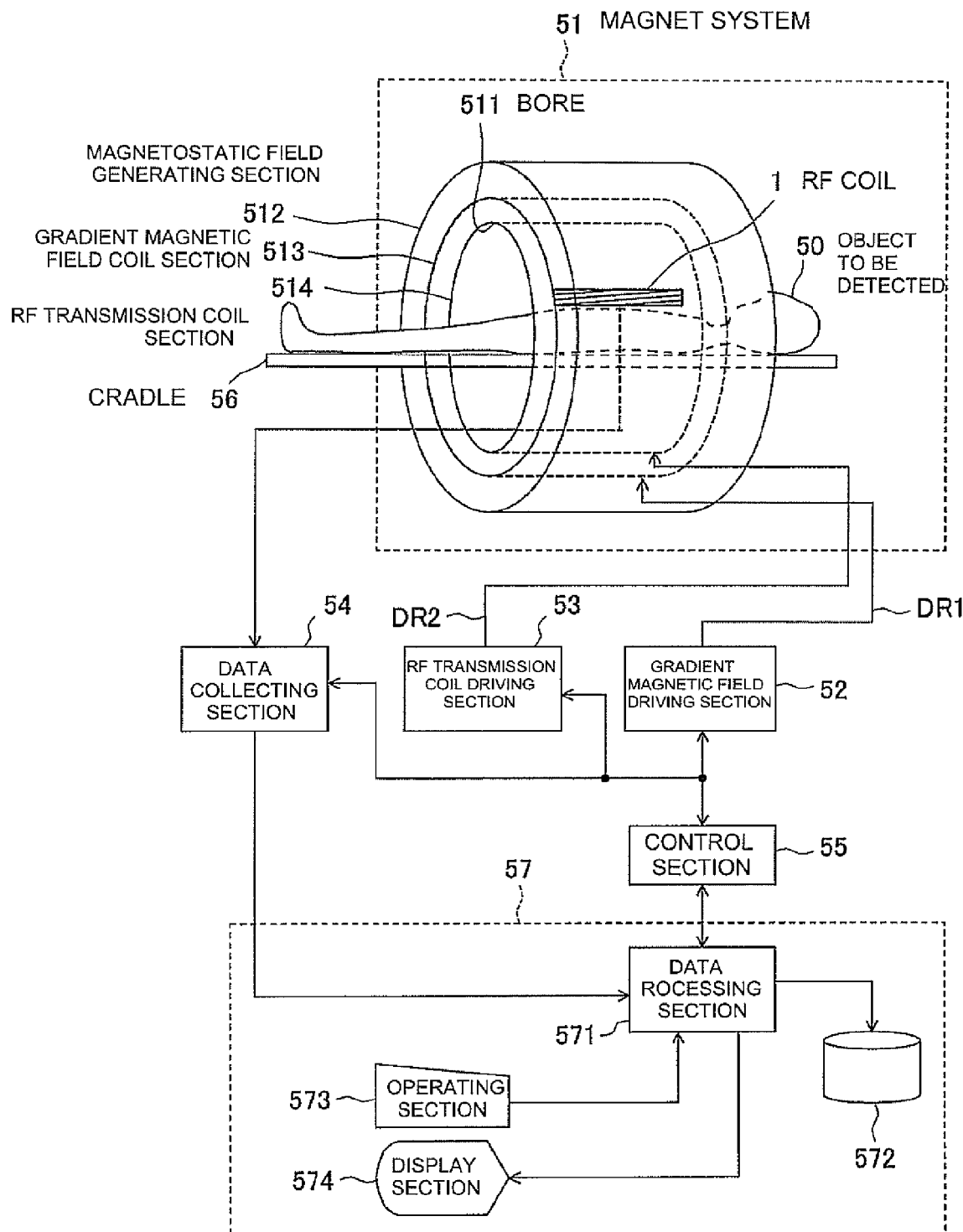
FIG. 2 is a diagram showing an example of an MRI apparatus when the RF coil according to a first embodiment of the invention is used to receive a magnetic resonance signal.

FIG. 2 is a diagram showing an example of the MRI apparatus when the RF coil according to the first embodiment of the invention is used to receive the magnetic resonance signal. As shown in FIG. 2, the MRI apparatus 5 has a magnet system 51, a gradient magnetic field driving section 52, an RF transmission coil driving section 53, a data collecting section 54, a control section 55, a cradle 56, and an operator console 57.

As shown in FIG. 2, the magnet system 51 has an inner space (bore) 511 that is substantially cylindrical, and the cradle 56 on which an object to be detected 50 is placed through a cushion is carried in the bore 511 by a carrying section not shown. As shown in FIG. 2, the RF coil 1, a magnetostatic field generating section 512, a gradient magnetic field coil section 513, and an RF transmission coil section 514 are disposed around a magnet center (scanning center position) within the bore 511 in the magnet system 51.

The magnetostatic field generating section 512 develops a magnetostatic field within the bore 511. A direction of the magnetostatic field is in parallel to a body axial direction of the object to be detected 50 in FIG. 2. That is, the MRI apparatus 5 is a horizontal magnetic field type MRI apparatus. However, the RF coil 1 according to this embodiment can be used for the vertical magnetic field type MRI apparatus.

The gradient magnetic field coil section 513 generates a gradient magnetic field that slopes the intensity of the magnetostatic field that has been developed by the magnetostatic field generating section 512 in order to give three-dimensional positional information to a magnetic resonance signal that is received by the RF coil 1 placed on an abdomen. The gradient magnetic field that is developed by the gradient magnetic field coil section 513 is of three types consisting of a slice select gradient magnetic field, a frequency encode gradient magnetic field, and a phase encode gradient magnetic field. The gradient magnetic field coil section 513 has the gradient magnetic field coils of three systems in correspondence with the gradient magnetic fields of those three types. The gradient magnetic field driving section 52 supplies a drive signal DR1 to the gradient magnetic field coil section 513 on the basis of an instruction from the control section 55 to develop the gradient magnetic field. The gradient magnetic field driving section 52 has driver circuits of three systems not shown in correspondence with the gradient magnetic field coils of three systems of the gradient magnetic field coil section 513.

The RF transmission coil section 514 excites spin of protons within the body of the object to be detected 50 within the magnetostatic space that has been developed by the magnetostatic field generating section 512, and transmits the RF pulse in order to generate the magnetic resonance signal. The RF transmission coil driving section 53 supplies a drive signal DR2 to the RF transmission coil section 514 on the basis of an instruction from the control section 55 to generate the RF pulse.

The data collecting section 54 takes in the magnetic resonance signal that has been received by the RF coil 1 which is placed in order to image the abdomen, and outputs the magnetic resonance signal to a magnetic processing section 571 of the operator console 57.

The controls section 55 controls the gradient magnetic field driving section 52 and the RF transmission coil driving section 53 according to a pulse sequence such as a high-speed spin echo method or a high-speed gradient echo method to generate the drive signal DR1 and the drive signal DR2. Also, the control section 55 controls the data collecting section 54.

As shown in FIG. 2, the operator console 57 includes a data processing section 571, an image database 572, an operating section 573, and a display section 574. The data processing section 571 conducts the control of the entire MRI apparatus 5 and the image reconstruction processing. The data processing section 571 is connected with the control section 55, and controls the control section 55 as a host of the control section 55. Also, the data processing section 571 is connected with the image database 572, the operating section 573, and the display section 574. The image database 572 is made up of, for example, a disk device that enables recording and reproduction, and records data that has been collected by the data collecting section 54, and the reconstructed image data that has been reconstructed. The operating section 573 is made up of a keyboard and a mouse. The display section 574 is made up of a graphic display and the like.

Figure 3:
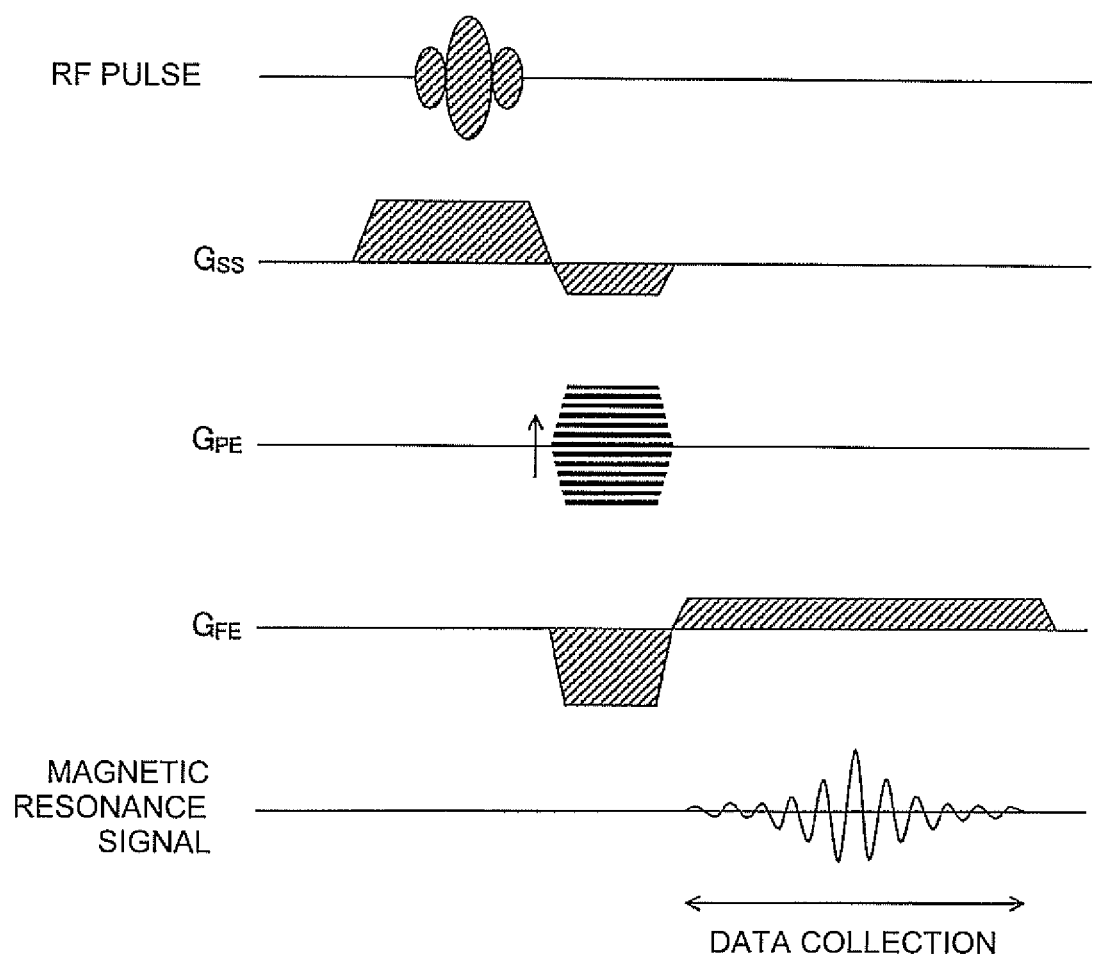
FIG. 3 is a diagram showing a pulse sequence according to a basic gradient echo method.

FIG. 3 is a diagram showing a pulse sequence of the basic gradient echo method. The magnetostatic field is always developed within the bore 511 of the MRI apparatus 5 by the magnetostatic field generating section 512. First, a slice select gradient magnetic field $G_{SS}$ is applied by the gradient magnetic field coil section 513, and at the same time, the RF transmission coil section 514 transmits the RF pulse. A specific slice of the object to be detected is selected according to the slice select gradient magnetic field $G_{ss}$ and the RF pulse to excite the spin of the protons within the slice. Then, a phase encode gradient magnetic field $G_{PE}$ is applied in a direction orthogonal to the slice select gradient magnetic field $G_{SS}$ by the gradient magnetic field coil section 513, and the phase of the magnetic resonance signal that is generated by the spin of the protons within the slice changes in the phase encode direction. Finally, a frequency encode gradient magnetic field $G_{FE}$ is applied by the gradient magnetic field coil section 513, and the frequency of the magnetic resonance signal changes in the frequency encode direction. Then, the magnetic resonance signal is received by the RF coil 1 while the frequency encode gradient magnetic field $G_{FE}$ is applied.

FIGS. 2 and 3 show an example in which the RF coil 1 is used to receive the magnetic resonance signal. Alternatively, the RF coil 1 can be used to transmit the RF pulse. The RF coil 1 is disposed in the vicinity of the surface of the object to be detected, thereby making it possible to suppress the RRF pulses that are irradiated to an area other than an area to be imaged to the minimum. For that reason, it is possible to suppress a specific absorption rate (SAR) of the area other than the area to be imaged per unit weight to the minimum.

FIGS. 4(a) and 4(b) are diagrams showing a relationship of the intensity Bo between the gradient magnetic field and the magnetostatic magnetic field. As shown in FIG. 4(a), the magnetostatic field having a constant intensity Bo is applied within the bore 511. In this situation, when the gradient magnetic field is applied, the magnetic field is added or subtracted with respect to the intensity Bo of the magnetostatic field, to thereby develop the magnetic field as shown in FIG. 4(b). The synthetic magnetic field at a center (x=0) is the intensity Bo of the magnetostatic field. However, as compared with the intensity Bo of the magnetostatic field, the slope of the gradient magnetic field is small. All of the slide select gradient magnetic field $G_{SS}$, the phase encode gradient magnetic field $G_{PE}$, and the frequency encode gradient magnetic field $G_{FE}$ have the relationship with the intensity Bo of the magnetostatic field as shown in FIGS. 4(a) and 4(b).

On the other hand, the center frequency of the transmitting PF pulse is the Larmor frequency $\omega_t$ that is represented by the following expression.

$$\omega_t = 2\pi f_t = \gamma B_t \quad \text{[Ex. 5]}$$

\γ is a magnetic rotation ratio, and $B_t$ is the intensity of the external magnetic field. There are two kinds of methods of selecting the position of the slice by means of the MRI apparatus 5, and the center frequency $B_t$ of the RF pulse is different depending on those methods.

A first slice position selecting method is a method in which the cradle 56 is moved so that the slice to be imaged is moved to a position of the magnetic field intensity Bo, that is, the position of x=0 in FIG. 4(b). In this case, the center frequency $B_t = \gamma B_O$. The RF pulse has the frequency band of a narrow width which corresponds to the width of the selected slice, centered on the center frequency $\gamma B_O$.

A second slice position selecting method is a method in which the frequency of the RF pulse changes in correspondence with the position x of the slice. In this case, $B_t$ is a sum of the intensity $B_{SS}(x)$ of the slice select gradient magnetic field corresponding to the position x of the selected slice and the intensity Bo of the magnetostatic field, which is $B_t = B_o + B_{SS}(x)$. In this way, the magnetic field intensity $B_t$ of the center of the RF pulse changes with the center of the intensity $B_o$ of the magnetostatic field. However, as described above, the slope of the slice select gradient magnetic field $G_{SS}$ is small. For that reason, the intensity $B_{SS}(x)$ of the slice select gradient magnetic field is extremely small as compared with the intensity $B_o$ of the magnetostatic field, and the center frequency $\gamma B_t$ of the RF pulse changes with an extremely narrow range centered on the Larmor frequency $\gamma B_O$. Accordingly, the Larmor frequency $\gamma B_O$ is not always included in the frequency band of the RF pulse, but the frequency included in the RF pulse is extremely close to the Larmor frequency $\gamma B_O$.

Figure 5:
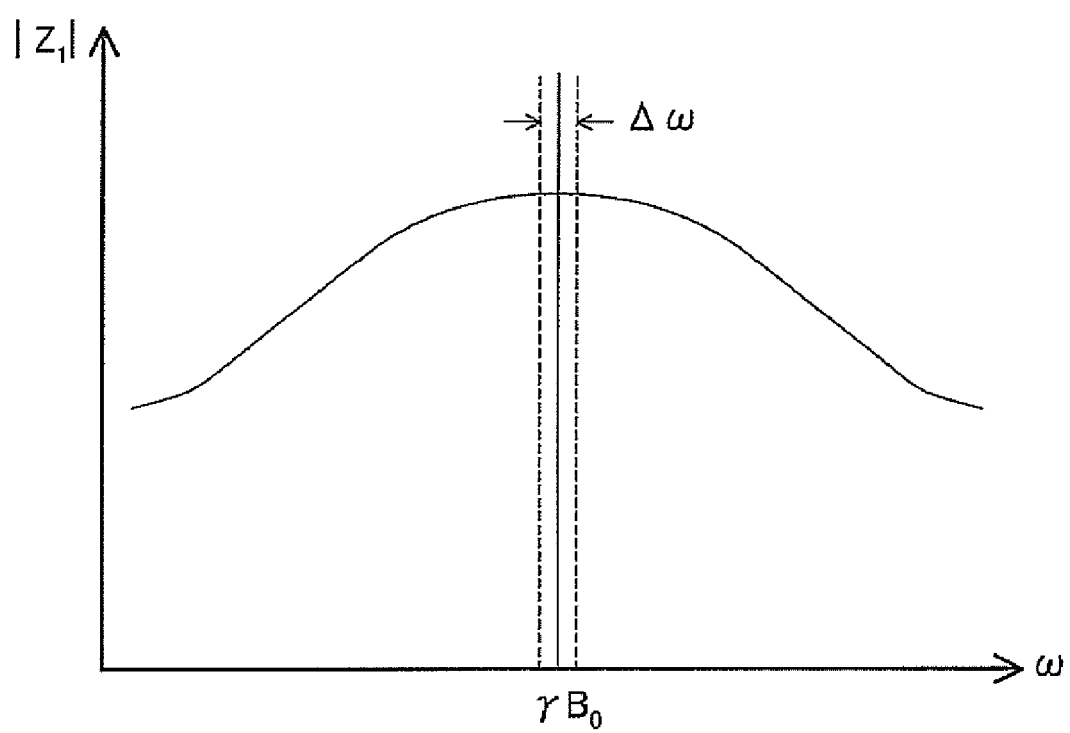
FIG. 5 is a diagram showing an example of a change in an impedance $Z_1$ between an x point and a y point of the RF coil.

FIG. 5 is a diagram showing an example of a change in the impedance $Z_1$ between the x point and the y point of the RF coil. FIG. 5 is an example in which the floating capacitance 3 and the impedance adjustment coil 4 resonate in parallel with the Larmor frequency $\gamma B_O$ corresponding to the intensity Bo of the magnetostatic field. The axis of abscissa represents the frequency $\omega$ of the current that flows in the conductive path of the RF coil 1, and the axis of ordinate represents the absolute value of the impedance $Z_1$. $\Delta\omega$ represents a range of the frequency in which a change of the impedance $Z_1$ is flat. The change in the impedance Z1 is closer to flat toward the Larmor frequency $\gamma B_O$ with the center of the Larmor frequency $\gamma B_O$.

In the case where the RF coil 1 is used to transmit the RF pulse, the flatness of the power of the RF pulse in the frequency region is lost unless a change in the impedance $Z_1$ is flat. For that reason, it is desirable that the floating capacitance 3 and the impedance adjustment coil 4 resonate in parallel at the Larmor frequency $\gamma B_O$. In this situation, a range in which the change in the impedance Z1 is assumed to be flat is widest in a range where the frequency of the RF pulse changes, and the degree of reducing the current $i_f$ that flows between the x point and the y point is largest.

However, it is not always necessary that the floating capacitance 3 and the impedance adjustment coil 4 resonate in parallel with the Larmor frequency $\gamma B_O$. Because the Larmor frequency $\gamma B_O$ is extremely high, when the floating capacitance 3 and the impedance adjustment coil 4 resonate in parallel in the frequency close to the Larmor frequency $\gamma B_O$, there can be obtained such advantages that the impedance $Z_1$ between the x point and the y point increases, and the current $i_f$ that flows between the x point and the y point reduces to the degree that the effect of the magnetic coupling between the right and left loops of the RF coil 1 can be ignored.

When the object to be detected 50 receives the RF pulse, only the spin of the proton within the selected slice is excited, and the magnetic resonance signal having the same frequency as the frequency of the RF pulse is generated. As described above, because the RF pulse has a constant band width, the frequency of the magnetic resonance signal that is generated from the excited slice also has the constant range.

When the frequency encode gradient magnetic field $G_{FE}$ is applied, the frequency of the magnetic resonance signal changes in the frequency encode direction according to the slope of the frequency encode gradient magnetic field $G_{FE}$. The magnetic resonance signal that is generated from the slice is superimposed on the magnetic resonance signal whose frequency has been changed. The center frequency is the Larmor frequency $\gamma B_O$ or the Larmor frequency $\gamma\{B_O + B_{ss}(x)\}$ depending on the above-mentioned slice position selecting method. A change in the magnetic field intensity which is caused by application of the frequency encode gradient magnetic field $G_{FE}$ is also extremely small as compared with the intensity Bo of the magnetostatic field. For that reason, when the frequency encode gradient magnetic field $G_{FE}$ is applied, the frequency of the magnetic resonance signal changes in a narrow range with the center of the Larmor frequency $\gamma B_O$.

Similarly, in the case where the RF coil 1 is used to receive the RF pulse, it is important that the change in the impedance $Z_1$ is flat as in the case of transmission. Unless the change in the impedance $Z_1$ is flat, the receiver sensitivity depends on the frequency, and the image quality of the reconstructed image is deteriorated. For that reason, it is desirable that the floating capacitance 3 and the impedance adjustment coil 4 resonate in parallel with the Larmor frequency $\gamma B_O$ even at the time of reception. In this situation, a range where the change in the impedance $Z_1$ is assumed to be flat is widest in the range where the frequency of the magnetic resonance signal changes, and the degree of reducing the current $i_f$ that flows between the x point and the y point is largest.

As in the case of transmission, when the RF coil 1 is used to receive the magnetic resonance signal, it is not always necessary that the floating capacitance 3 and the impedance adjustment coil 4 resonate in parallel with the Larmor frequency $\gamma B_O$ that is in proportion to the intensity Bo of the magnetostatic field. Because the Larmor frequency $\gamma B_O$ is extremely high, when the floating capacitance 3 and the impedance adjustment coil 4 resonate in parallel in the frequency close to the Larmor frequency $\gamma B_O$, there can be obtained such advantages that the impedance $Z_1$ between the x point and the y point increases, and the current $i_f$ that flows between the x point and the y point reduces to the degree that the effect of the magnetic coupling between the right and left loops of the RF coil 1 can be ignored.

Figure 6:
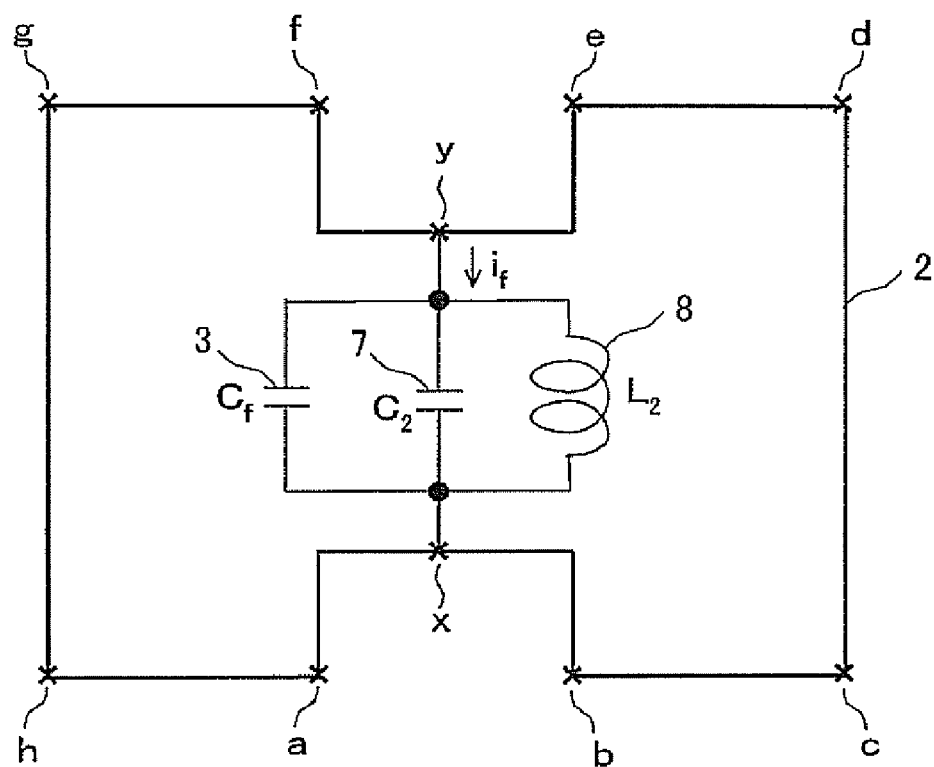
FIG. 6 is a diagram showing an RF coil according to a second embodiment of the invention.

FIG. 6 is a diagram showing an RF coil according to a second embodiment of the invention. An RF coil 6 is made up of an 8-shaped coil 2, an impedance adjustment capacitor 7 that performs connection between the x point and the y point at which the conductive path of the 8-shaped coil 2 crosses, in parallel, and an impedance adjustment coil 8. The RF coil 6 shown in FIG. 6 is also used to, for example, receive the magnetic resonance signal by the aid of the MRI apparatus 5 shown in FIG. 2 as with the RF coil 1 according to the first embodiment, and also used to transmit the RF pulse.

When it is assumed that the capacitance of the impedance adjustment capacitor 7 is $C_2$ and the inductance of the impedance adjustment coil 8 is $L_2$, an impedance $Z_2$ between the x point and the y point in a frequency ω of a magnetic resonance signal in the RF coil 6 is represented by the following expression.

$$Z_2 = -\frac{j}{\omega(C_f + C_2) - \frac{1}{\omega L_2}} \quad [\text{Ex. 6}]$$

As the values of $\omega(C_f+C_2)$ and $1/\omega L_2$ approach each other more, the impedance $Z_2$ becomes larger, and the current $i_f$ that flows between the x point and the y point is smaller.

When the floating capacitance 3, the impedance adjustment capacitor 7, and the impedance adjustment coil 8 resonate in parallel, the absolute value of the impedance $Z_2$ becomes infinitely large, and the current $i_f$ becomes 0. In this situation, the frequency $\omega_p$ is represented by the following expression.

$$\omega_P = \frac{1}{\sqrt{(C_f + C_2)L_2}} \quad [\text{Ex. 7}]$$

In fact, the impedance adjustment coil 8 has a resistance although the resistance is extremely small. For that reason, when the capacitance $C_2$ of the impedance adjustment capacitor 7 and the inductance $L_2$ of the impedance adjustment coil 8 are set so that parallel resonance is conducted with the frequency $\omega_p$ of the magnetic resonance signal, the impedance $Z_2$ becomes an external value, and the current $i_f$ that flows in the x point and the y point becomes minimum.

As described above, the frequency included in the RF pulse is extremely close to the Larmor frequency $\gamma B_O$ that is in proportion to the intensity Bo of the magnetostatic field. For that reason, in the case where the RF coil 6 is used to transmit the RF pulse, it is desirable that the floating capacitance 3, the impedance adjustment capacitor 7, and the impedance adjustment coil 8 resonate in parallel with the Larmor frequency $\gamma B_O$. In this situation, a range in which the change in the impedance $Z_2$ is assumed to be flat is widest in the range where the frequency of the RF pulse changes, and the degree of reducing the current $i_f$ that flows between the x point and the y point is largest.

However, it is not always necessary that the floating capacitance 3, the impedance adjustment capacitor 7, and the impedance adjustment coil 8 resonate in parallel with the Larmor frequency $\gamma B_O$. Because the Larmor frequency $\gamma B_O$ is extremely high, when the floating capacitance 3, the impedance adjustment capacitor 7, and the impedance adjustment coil 8 resonate in parallel in the frequency close to the Larmor frequency $\gamma B_O$, there can be obtained such advantages that the impedance $Z_2$ between the x point and the y point increases, and the current $i_f$ that flows between the x point and the y point reduces to the degree that the effect of the magnetic coupling between the right and left loops of the RF coil 6 can be ignored.

Also, in the case where the RF coil 6 is used to receive the RF pulse, it is important that the change in the impedance $Z_2$ is flat as in the case of transmission. For that reason, it is desirable that the floating capacitance 3, the impedance adjustment capacitor 7, and the impedance adjustment coil 8 resonate in parallel with the Larmor frequency $\gamma B_O$ even at the time of reception. In this situation, a range in which the change in the impedance $Z_2$ is assumed to be flat is widest in the range where the frequency of the magnetic resonance signal changes, and the degree of reducing the current $i_f$ that flows between the x point and the y point is largest.

However, as in the case of transmission, when the RF coil 6 is used to receive the magnetic resonance signal, it is not always necessary that the floating capacitance 3, the impedance adjustment capacitor 7, and the impedance adjustment coil 8 resonate in parallel with the Larmor frequency $\gamma B_O$. Because the Larmor frequency $\gamma B_O$ is extremely high, when the floating capacitance 3, the impedance adjustment capacitor 7, and the impedance adjustment coil 8 resonate in parallel in the frequency close to the Larmor frequency $\gamma B_O$, there can be obtained such advantages that the impedance $Z_2$ between the x point and the y point increases, and the current $i_f$ that flows between the x point and the y point reduces to the degree that the effect of the magnetic coupling between the right and left loops of the RF coil 6 can be ignored.

The RF coil 6 according to the second embodiment becomes larger as the values of $\omega(C_f+C_2)$ and $1/\omega L_2$ approach each other more. Accordingly, the inductance $L_2$ can be decreased as much as the capacitance $C_2$ is added to the floating capacitance Cf as compared with the inductance $L_1$ of the impedance adjustment coil 4 that is used in the RF coil 1 according to the first embodiment. For that reason, the impedance adjustment coil 8 of the RF coil 6 according to the second embodiment is smaller in the configuration than the impedance adjustment coil 4 of the RF coil 1 according to the first embodiment.

As was described above, according to the RF coil 1 of the first embodiment and according to the RF coil 2 of the second embodiment, it is possible to reduce the current that flows through the floating capacitance of the crossing points of the conductive path in the resonance frequency of the MRI apparatus 5. For that reason, the RF coil 1 or the RF coil 6 is used in the MRI apparatus 5, thereby making it possible to reduce the number of decoupling circuits for removal of the magnetic coupling. Also, because the RF coil 1 and the RF coil 6 are capable of increasing the width of the conductive path in the crossing points, it is possible to reduce the resistance of the conductive path in the crossing points. For that reason, it is possible to improve the transmission efficiency of the RF pulse and the receiving sensitivity of the magnetic resonance signal.

In addition, the RF coil 1 or the RF coil 6 is combined with a loop type coil, thereby making it possible to construct a quadrature coil. With the quadrature coil, it is possible to improve the transmission efficiency more than that in the case where the single substance of the RF coil 1 or the RF coil 6 is used at the time of transmission. Also, it is possible to improve the S/N ratio more than that in the case where the single substance of the RF coil 1 or the RF coil 6 is used at the time of reception.

Many widely different embodiments of the invention may be configured without departing from the spirit and the scope of the present invention. It should be understood that the present invention is not limited to the specific embodiments described in the specification, except as defined in the appended claims.

The invention claimed is:

1. An RF coil for an MRI apparatus comprising:
    an 8-shaped coil having a figure-8 configuration through which a conductive path crosses; and
    an impedance adjustment coil that connects crossing points of the conductive path, wherein the crossing points of the conductive path are connected in parallel through the impedance adjustment coil that is connected in parallel with a floating capacitance between the crossing points of the conductive path, and in a Larmor frequency that is in proportion to the intensity of a magnetostatic field, an impedance between the crossing points of the conductive path is increased and a current that flows between the crossing points of the conductive path is reduced.

2. The RF coil for an MRI apparatus according to claim 1, wherein the impedance adjustment coil and the floating capacitance that is developed between the crossing points of the conductive path resonate in parallel in the Larmor frequency that is in proportion to the intensity of the magnetostatic field.

3. The RF coil for an MRI apparatus according to claim 1, further comprising: an impedance adjustment capacitor that connects n the crossing points of the conductive path,
wherein the crossing point of the conductive path is connected in parallel by the impedance adjustment capacitor, the impedance adjustment coil, and the floating capacitance developed between the crossing points of the conductive path.

4. The RF coil for an MRI apparatus according to claim 3, wherein the impedance adjustment capacitor, the impedance adjustment coil, and the floating capacitance that is developed between the crossing points of the conductive path resonate in parallel in the Larmor frequency that is in proportion to the intensity of the magnetostatic field.

5. The RF coil for an MRI apparatus according to claim 1, wherein two 8-shaped coils are combined to form a quadrature coil.

6. The RF coil for an MRI apparatus according to claim 1, wherein the RF coil facilitates improving a transmission frequency of an RF pulse transmitted from the RF coil.

7. The RF coil for an MRI apparatus according to claim 1, wherein the RF coil facilitates improving a receiving sensitivity of a magnetic resonance signal formed by the RF coil.

8. A method of using an RF coil for an MRI apparatus including an 8-shaped coil having a figure-8 configuration through which a conductive path crosses, and an impedance adjustment coil that connects crossing points of the conductive path, wherein the crossing points of the conductive path are connected in parallel through the impedance adjustment coil that is connected in parallel with a floating capacitance between the crossing points of the conductive path, the method comprising:
applying a magnetostatic field of an intensity that an impedance between the crossing points of the conductive path is increased, and a current that flows between the crossing points of the conductive path is reduced.

9. The method of using an RF coil for an MRI apparatus according to claim 8,
wherein a magnetostatic field of the intensity that the impedance adjustment coil and the floating capacitance between the crossing points of the conductive path resonate in parallel is applied.

10. The method of using an RF coil for an MRI apparatus according to claim 8,
wherein the RF coil for an MRI apparatus includes an impedance adjustment capacitor that connects the crossing points of the conductive path, and the crossing points of the conductive path are connected in parallel by the impedance adjustment capacitor, the impedance adjustment coil, and the floating capacitance developed between the crossing points of the conductive path.

11. The method of using an RF coil for an MRI apparatus according to claim 10,
wherein the magnetostatic field of the intensity that the impedance adjustment capacitor, the impedance adjustment coil, and the floating capacitance that is developed between the crossing points of the conductive path resonate in parallel is applied.

12. The method of using an RF coil for an MRI apparatus according to claim 8, further comprising combining two 8-shaped coils to form a quadrature coil.

13. The method of using an RF coil for an MRI apparatus according to claim 8, further comprising configuring the RF coil to improve a transmission frequency of an RF pulse transmitted from the RF coil.

14. The method of using an RF coil for an MRI apparatus according to claim 8, further comprising configuring the RF coil to improve a receiving sensitivity of a magnetic resonance signal formed by the RF coil.

15. An MRI apparatus comprising:
an RF coil having an 8-shaped coil having a figure-8 configuration through which a conductive path crosses, and an impedance adjustment coil that connects crossing points of the conductive path, wherein the crossing points of the conductive path are connected in parallel through the impedance adjustment coil that is connected in parallel with a floating capacitance between the crossing points of the conductive path, and in a Larmor frequency that is in proportion to the intensity of a magnetostatic field, an impedance between the crossing points of the conductive path is increased, and a current that flows between the crossing points of the conductive path is reduced, and
wherein the RF coil is allowed to transmit the RF pulse, receive the magnetic resonance signal, or transmit the RF pulse and receive the magnetic resonance signal.

16. The MRI apparatus according to claim 15, wherein the impedance adjustment coil and the floating capacitance that is developed between the crossing points of the conductive path resonate in parallel in the Larmor frequency that is in proportion to the intensity of the magnetostatic field.

17. The MRI apparatus according to claim 15, further comprising: an impedance adjustment capacitor that connects the crossing points of the conductive path,
wherein the crossing points of the conductive path are connected in parallel by the impedance adjustment capacitor, the impedance adjustment coil, and the floating capacitance developed between the crossing points of the conductive path.

18. The MRI apparatus according to claim 17,
wherein the impedance adjustment capacitor, the impedance adjustment coil, and the floating capacitance that is developed between the crossing points of the conductive path resonate in parallel in the Larmor frequency that is in proportion to the intensity of the magnetostatic field.

19. The MRI apparatus according to claim 15, wherein two 8-shaped coils are combined to form a quadrature coil.

20. The MRI apparatus according to claim 15, wherein the RF coil facilitates:
improving a transmission frequency of an RF pulse transmitted from the RF coil; and
improving a receiving sensitivity of a magnetic resonance signal formed by the RF coil.

* * * * *